United States Patent
Lee

(10) Patent No.: US 11,353,516 B2
(45) Date of Patent: Jun. 7, 2022

(54) APPARATUS AND METHOD FOR CALCULATING SOH OF BATTERY PACK

(71) Applicant: LG CHEM, LTD., Seoul (KR)

(72) Inventor: Hyun Chul Lee, Daejeon (KR)

(73) Assignee: LG ENERGY SOLUTION, LTD., Seoul (KR)

(*) Notice: Subject to any disclaimer, the term of this patent is extended or adjusted under 35 U.S.C. 154(b) by 293 days.

(21) Appl. No.: 16/651,526

(22) PCT Filed: Aug. 30, 2018

(86) PCT No.: PCT/KR2018/010088
§ 371 (c)(1),
(2) Date: Mar. 27, 2020

(87) PCT Pub. No.: WO2019/066274
PCT Pub. Date: Apr. 4, 2019

(65) Prior Publication Data
US 2020/0264237 A1    Aug. 20, 2020

(30) Foreign Application Priority Data
Sep. 29, 2017    (KR) .................. 10-2017-0127887

(51) Int. Cl.
G06F 11/30    (2006.01)
G01R 31/392    (2019.01)
G01R 31/396    (2019.01)
G01R 31/3832    (2019.01)

(52) U.S. Cl.
CPC ....... *G01R 31/392* (2019.01); *G01R 31/3832* (2019.01); *G01R 31/396* (2019.01)

(58) Field of Classification Search
CPC .................................................. G01R 31/392
See application file for complete search history.

(56) References Cited

U.S. PATENT DOCUMENTS

| 5,539,318 A | 7/1996 | Sasaki |
| 6,285,163 B1 | 9/2001 | Watanabe et al. |
| 2009/0051322 A1 | 2/2009 | Kubota et al. |
| 2015/0070024 A1* | 3/2015 | Kim ............. H01M 10/48 324/430 |
| 2015/0293183 A1* | 10/2015 | Tenmyo .......... H02J 7/0049 324/429 |
| 2016/0101708 A1 | 4/2016 | Zhang et al. |
| 2016/0131720 A1 | 5/2016 | Baba et al. |
| 2016/0291094 A1 | 10/2016 | Gagneur et al. |

(Continued)

FOREIGN PATENT DOCUMENTS

| CN | 104155610 A | 11/2014 |
| EP | 1 314 992 A2 | 5/2003 |

(Continued)

OTHER PUBLICATIONS

International Search Report issued in PCT/KR2018/010088 (PCT/ISA/210), dated Dec. 11, 2018.

(Continued)

*Primary Examiner* — Phuong Huynh
(74) *Attorney, Agent, or Firm* — Birch, Stewart, Kolasch & Birch, LLP

(57) ABSTRACT

A method for calculating an accurate SOH of a battery pack by reducing an error occurring during SOH calculation of the battery pack.

10 Claims, 2 Drawing Sheets

(56) References Cited

U.S. PATENT DOCUMENTS

2017/0242078 A1    8/2017  Kuper et al.
2020/0264237 A1*   8/2020  Lee ..................... G01R 31/392

FOREIGN PATENT DOCUMENTS

| | | |
|---|---|---|
| JP | 2003-224901 A | 8/2003 |
| JP | 2008-62904 A | 3/2008 |
| JP | 2015-52482 A | 3/2015 |
| JP | WO2014/083856 A1 | 1/2017 |
| JP | 6123844 B2 | 5/2017 |
| JP | JR 2017-139954 A | 8/2017 |
| KR | 10-0425352 B1 | 3/2004 |
| KR | 10-2011-0084633 A | 7/2011 |
| KR | 10-1399388 B1 | 5/2014 |
| KR | 101399388 * | 5/2014 |
| KR | 10-2015-0029204 A | 3/2015 |
| KR | 10-2016-0014165 A | 2/2016 |
| WO | WO 2015/040326 A1 | 3/2015 |

OTHER PUBLICATIONS

Extended European Search Report for European Patent Application No. 18860018.3 dated Oct. 8, 2020.

* cited by examiner

[fig1]
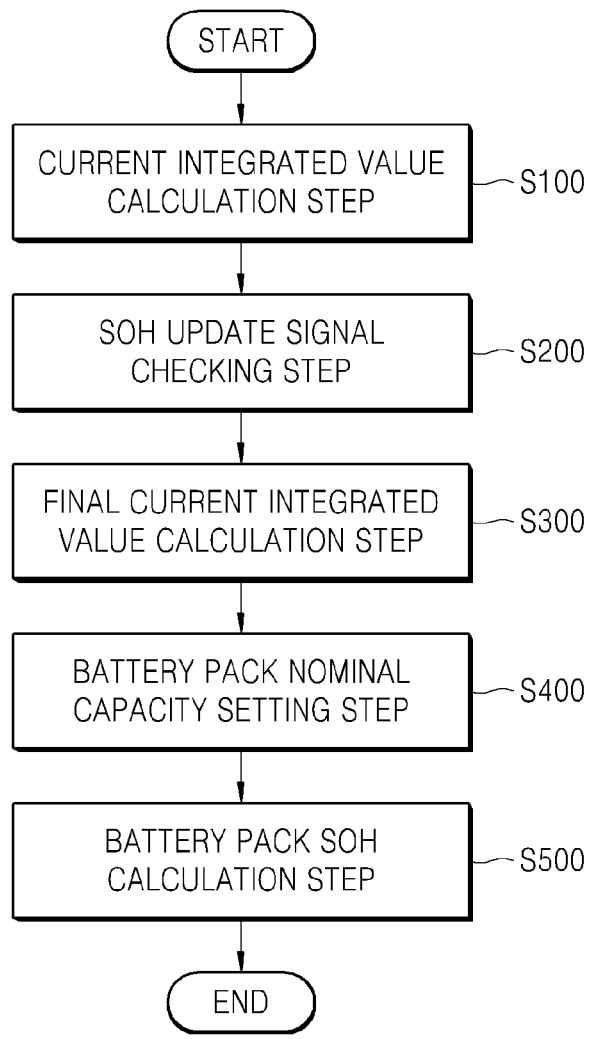

[fig2]
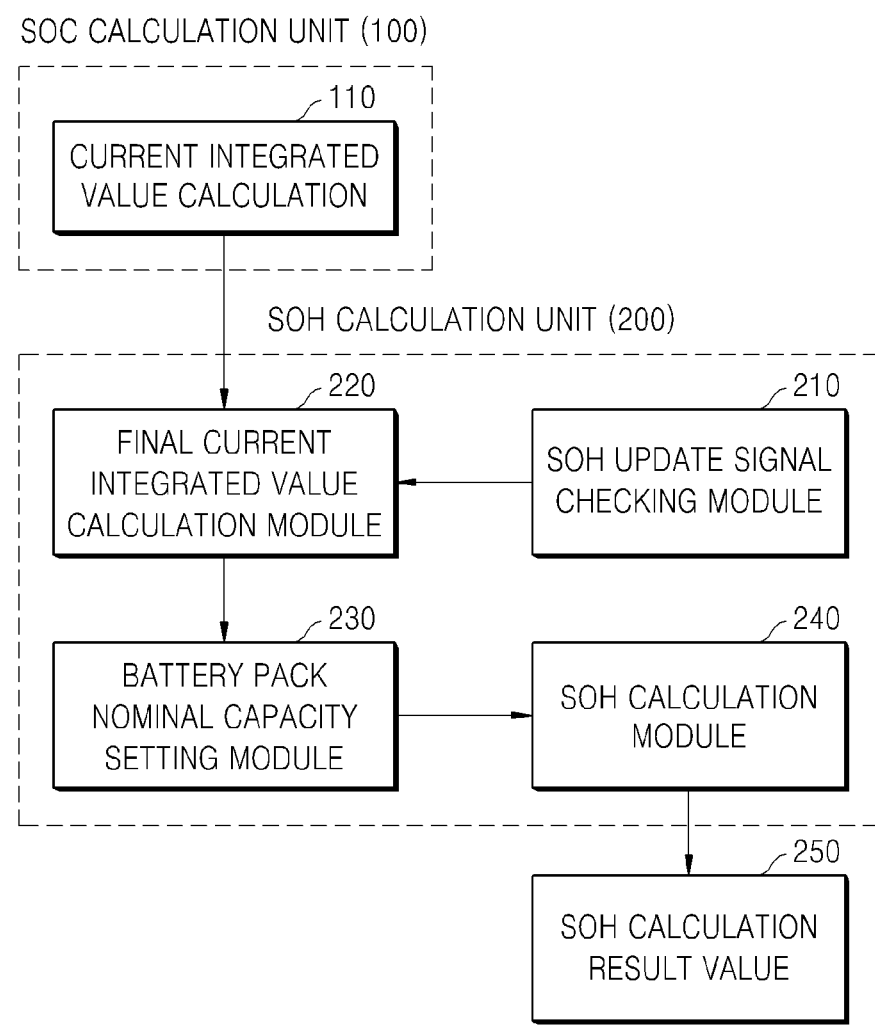

APPARATUS AND METHOD FOR CALCULATING SOH OF BATTERY PACK

TECHNICAL FIELD

The present invention relates to an apparatus and a method for calculating an SOH of a battery pack.
More particularly, the present invention relates to an apparatus and a method for calculating an accurate SOH of a battery pack by reducing an error occurring during SOH calculation of the battery pack.

BACKGROUND ART

Unlike a non-rechargeable primary battery, a secondary battery refers to a rechargeable battery and is widely used not only in the fields of smart electronic devices such as smart phones, notebook computers, PDAs, but also electric vehicles and energy storage systems. The battery capacity decreases depending on the usage environment, the period of use, the number of charge/discharge cycles, and so on. As an indicator of how much the battery capacity is smaller than the initial battery capacity described in the specification, the SOH of the battery is one of the important parameters for evaluating the battery.

The following equation may be used to estimate the SOH of the battery.

$$SOH = \frac{\int i \cdot dt}{\Delta SOC \times \text{Capacity}_{nominal}}$$

(i: current, $\Delta SOC$: change in SOC, Capacity nominal: nominal capacity of battery pack)

At this time, $\int i \cdot dt$ is a value for integrating the current.

However, during the current integration, an error value (error 1) occurs in the current sensor for measuring the current value.

The nominal capacity value of the battery pack, as the capacity of the battery cell set at the time of manufacturing the battery cell, also had an error value (error2) for the capacity of the battery cell.

Therefore, the equation used to actually calculate the SOH may be as follows.

$$SOH = \frac{\int (i + \text{error1}) \cdot dt}{\Delta SOC \times (\text{Capacity}_{nominal} + \text{error2})}$$

(i: current, $\Delta SOC$: change in SOC, Capacity nominal: nominal capacity of battery pack)

As above, there are two errors (error 1, error 2) in the values used for calculating the SOH, so that it is difficult to calculate the accurate SOH.

Therefore, in the present invention, a method of calculating an accurate state of health (SOH) of the battery by reducing erroe2 occurring in the nominal capacity is proposed.

DISCLOSURE

Technical Problem

The present invention provides a method for accurately calculating the SOH of a battery pack.

More particularly, the present invention provides a method for calculating an accurate SOH of a battery pack by reducing an error occurring during SOH calculation of the battery pack.

Technical Solution

To achieve these and other advantages and in accordance with the purpose of the present invention, as embodied and broadly described, there is provided a According to another aspect of the present invention, there is provided According to a further another aspect of the present invention, there is provided

Advantageous Effects

The present invention may reduce errors occurring in the SOH calculation process of the battery pack in order to more accurately calculate the SOH of the battery pack.

DESCRIPTION OF DRAWINGS

FIG. 1 is a flowchart showing an SOH calculating method of a battery pack according to an embodiment of the present invention.

FIG. 2 is a view showing a device for calculating an SOH of a battery pack according to another embodiment of the present invention.

BEST MODE FOR CARRYING OUT THE INVENTION

Hereinafter, embodiments of the present invention will be described in detail with reference to the accompanying drawings so that those skilled in the art may easily carry out the present invention. The present invention may, however, be embodied in different forms and should not be construed as limited to the embodiments set forth herein. Parts not relating to description are omitted in the drawings in order to clearly describe the present invention and like reference numerals refer to like elements throughout.

Although the terms "initial," "second," etc., may be used herein to describe various elements, these elements should not be limited by these terms. The above terms are used only to distinguish one component from another. For example, an initial component may be referred to as a second component and vice versa without departing from the scope of the present invention. Terms used in this specification are used to describe specific embodiments, and are not intended to limit the scope of the present invention. The singular expressions include plural expressions unless the context clearly dictates otherwise.

Throughout the specification, when a portion is referred to as being "connected" to another portion, it includes not only "directly connected" but also "electrically connected" with another element therebetween. Furthermore, when it is described that one comprises (or includes or has) some elements, it should be understood that it may comprise (or include or has) only those elements, or it may comprise (or include or have) other elements as well as those elements if there is no specific limitation. The term "~ing operation" or "operation of ~ing" used throughout the specification does not mean "operation for ~ing".

Terms used in this specification may be currently widely used general terms in consideration of functions in the present invention but may vary according to the intents of those skilled in the art, precedents, or the advent of new technology. Additionally, in certain cases, there may be terms the applicant selects arbitrarily and in this case, their meanings are described in a corresponding description part of the present invention. Accordingly, terms used in the present invention should be defined based on the meaning of the term and the entire contents of the present invention instead of the simple term name.

1. Method for calculating SOH of battery pack according to embodiment of present invention.

The present invention is for more precisely calculating the SOH of a battery pack by reducing an error occurring in the SOH calculation process of the battery pack.

FIG. 1 is a flowchart showing an SOH calculating method of a battery pack according to an embodiment of the present invention.

Hereinafter, an SOH calculation method of a battery pack according to an embodiment of the present invention will be described with reference to FIG. 1.

A method for calculating a state of health (SOH) of a battery pack may be configured including a current integrated value calculation step corresponding to an SOC change amount of calculating a current integrated value corresponding to the SOC change amount using a current integration method (S100), an SOH update signal checking step of checking whether an SOH update signal is applied and a condition of the SOH update signal (S200); a final current integrated value calculation step of calculating a final current integrated value based on a current integrated value corresponding to the SOC change amount when the SOH update signal satisfies a predetermined condition in the SOH update signal checking step (S300); a battery pack nominal capacity setting step of setting a nominal capacity of the battery pack to a final current integrated value calculated in the final current integrated value calculation step when the final current integrated value calculation step is performed (S400); and a battery pack SOH calculation step of calculating the SOH of the battery pack based on the nominal capacity of the battery pack set in the battery pack nominal capacity setting step (S500).

More specifically, the current integrated value calculation step corresponding to the SOC change amount (S100) may be repeatedly performed at a predetermined period and may be calculated based on the following Equation 1.

$$\Delta SOC = \int_{SOC_{start}}^{SOC_{end}} (i + \text{error1}) \cdot dt \qquad \text{(Equation 1)}$$

Meanwhile, the current integrated value corresponding to the SOC change amount calculated in the current integrated value calculation step 100 corresponding to the SOC change amount may be stored in the memory or transmitted to the SOH calculation unit.

In such a manner, the current integrated value stored in the memory or corresponding to the SOC change amount transmitted to the SOH calculation unit may be used in a final current integrated value calculation step described later.

Moreover, the SOH update signal checking step (S200) may be configured including an SOH update signal authorization step of checking whether or not an SOH update signal is applied to the SOH calculation unit, and an initial signal presence checking and use time checking step of checking whether the SOH update signal received from the BMS of the battery pack is an initial update signal when the SOH update signal is received from the BMS of the battery pack, and checking whether or not the use period of the battery pack is within the initial use period.

More specifically, the SOH update signal authorization step (S300) has a predetermined period and in the middle of performing the current integrated value calculation step corresponding to the SOC change amount, an SOH update signal may be applied to the SOH calculation unit in the form of an interrupt. When the SOH calculation unit receives an SOH signal in the interrupt type, in a case where the SOH calculation unit is an initial SOH calculation signal and the battery use period is within the initial use period, a final current integrated value calculation step to be described later may be performed on the basis of a current integrated value corresponding to the most recently stored SOC change amount or a current integrated value corresponding to the most recently received SOC change amount.

Meanwhile, the final current integrated value calculation step (S400) may calculate a final current integrated value of the SOC calculated from the current integrated value calculation step corresponding to the SOC change amount until the SOC becomes 100 from 0 using a proportional equation.

For example, if the SOC changes from 40 to 45 in the current integrated value calculation step corresponding to the SOC change amount, at this time, if the current integrated value is 10, the current integrated value corresponding to the SOC change amount of 5 may be 10. Using this, if the SOC changes from 0 to 100, the final integrated current value may be calculated as 200 using a proportional equation.

In such a way, if the nominal capacity of the battery is calculated based on the accumulated integrated value corresponding to the SOC change amount and is set to the nominal capacity of the battery pack, it is possible to eliminate the error (error2) included in the nominal capacity of the battery cell, which is preset when the battery pack described in the background art is manufactured.

Also, since the nominal capacity of the battery cell set by the above method is calculated on the basis of a value reflecting an error (error 1) already generated in the current sensor in the current integration step corresponding to the SOC change amount, the error (error 1) generated in the current sensor may be reduced from the finally calculated SOH value.

Therefore, an accurate SOH may be calculated.

Meanwhile, if the SOH update signal is not applied or the applied SOH update signal is out of the initial use period of the battery pack in the SOH update signal checking step (S300), without resetting the nominal capacity of the battery pack, the nominal capacity of the battery pack containing the error (eorrr2) set at the time of battery production is used as it is, so that the SOH of the battery pack may be calculated.

Meanwhile, the battery pack SOH calculation step (S500) may be calculated by the following Equation 2.

$$SOH = \frac{\int (i + \text{error1}) \cdot dt}{\Delta SOC \times (\text{nominal capacity of battery pack})} \qquad \text{(Equation 2)}$$

2. Device for calculating SOH of battery pack according to another embodiment of present invention.

FIG. 2 is a view showing a device for calculating an SOH of a battery pack according to another embodiment of the present invention.

Hereinafter, an SOH calculation device for a battery pack according to another embodiment of the present invention will be described with reference to FIG. 2.

The SOH calculation device of a battery pack according to another embodiment of the present invention may be configured including an SOC calculation unit 100 for calculating the SOC of the battery at predetermined period intervals, and an SOH calculation unit 200 for calculating an SOH based on the SOC measured by the SOC calculation unit 100.

More specifically, the SOC calculation unit 100 may be configured including a current integrated value calculation module 110 for calculating a current integrated value corresponding to an SOC change amount of the battery, and the SOH calculation unit 200 may be configured including an SOH update signal checking module 210 for checking whether an SOH update signal is applied, a final current integrated value calculation module 220 for calculating a final current integrated value based on a current integrated value corresponding to the SOC change amount calculated by the current integrated value calculation module 110, a battery pack nominal capacity setting module 230 for setting the nominal capacity of the battery pack, an SOH calculation module 240 for calculating the SOH of the battery pack and an SOH calculation result value 250 indicating the calculated SOH of the battery pack.

On the other hand, the current integrated value calculation module 110 for calculating a current integrated value corresponding to the SOC change amount calculates a current integrated value based on Equation 1 below, and calculate a current integrated value corresponding to the SOC change amount in a predetermined period until the SOH update signal is checked in the SOH update signal checking module.

$$\Delta SOC = \int_{SOC_{start}}^{SOC_{end}} (i + \text{error1}) \cdot dt \quad \text{(Equation 1)}$$

On the other hand, the current integrated value corresponding to the SOC change amount calculated based on Equation 1 may be stored in the memory or transmitted to the SOH calculation unit 200.

In such a manner, the current integrated value stored in the memory or corresponding to the SOC change amount transmitted to the SOH calculation unit may be used in a final current integrated value calculation module described later.

On the other hand, the SOH update signal checking module 210 may be configured including an initial SOH signal checking module for checking whether the SOH update signal is an initial SOH update signal and a use period checking module for checking whether the SOH update signal is within an initial use period preset in the battery pack.

Meanwhile, according to a result of checking by the SOH update signal checking module, if it is an initial SOH update signal, and the initial SOH update signal is applied within the initial use period of the battery pack, the final current integrated value calculation module 220 may calculate the final integrated value of the current integrated value corresponding to the SOC change amount until the SOC becomes 100 from 0 using a proportional equation.

In such a way, if the nominal capacity of the battery is calculated based on the accumulated integrated value corresponding to the SOC change amount and is set to the nominal capacity of the battery pack, it is possible to eliminate the error (error2) included in the nominal capacity of the battery cell, which is preset when the battery pack described in the background art is manufactured.

Meanwhile, if it is checked in the SOH update signal checking module 210 that the SOH update signal is not applied to the SOH calculation unit 200 or the applied SOH update signal is out of the initial use period of the battery pack, without resetting the nominal capacity of the battery pack, the nominal capacity of the battery pack containing the error (eorrr2) set at the time of battery production is used as it is, so that the SOH of the battery pack may be calculated.

Also, since the nominal capacity of the battery cell set by the above method is calculated on the basis of a value reflecting an error (error 1) already generated in the current sensor in the current integration step corresponding to the SOC change amount, the error (error 1) generated in the current sensor may be reduced from the finally calculated SOH value.

On the other hand, the battery pack SOH calculation module 240 may calculate the SOH of the battery pack using Equation 2 below.

$$SOH = \frac{\int (i + \text{error1}) \cdot dt}{\Delta SOC \times (\text{nominal capacity of battery pack})} \quad \text{(Equation 2)}$$

On the other hand, although the technical idea of the present invention is specifically described with reference to the above embodiments, it should be noted that the above embodiments are for the purpose of explanation and not for the purpose of limitation. It will be apparent to those skilled in the art that various modifications and variations may be made in the present invention without departing from the spirit and scope of the invention.

The invention claimed is:

1. A method for calculating a state of health (SOH) of a battery pack, the method comprising:
   a current integrated value calculation step corresponding to an SOC change amount of calculating a current integrated value corresponding to the SOC change amount using a current integration method;
   an SOH update signal checking step of checking whether an SOH update signal is applied and a condition of the SOH update signal;
   a final current integrated value calculation step of calculating a final current integrated value based on the current integrated value corresponding to the SOC change amount when the SOH update signal satisfies a predetermined condition in the SOH update signal checking step;
   a battery pack nominal capacity setting step of setting a nominal capacity of the battery pack to the final current integrated value calculated in the final current integrated value calculation step when the final current integrated value calculation step is performed; and
   a battery pack SOH calculation step of calculating the SOH of the battery pack based on the nominal capacity of the battery pack set in the battery pack nominal capacity setting step.

2. The method of claim 1, wherein the current integrated value calculation step corresponding to the SOC change amount is calculated based on the following Equation 1, and is repeatedly performed at a predetermined period until checking that the SOH update signal is applied in the SOH update signal checking step, $$\Delta SOC = \int_{SOC_{start}}^{SOC_{end}} (i + \text{error1}) \cdot dt. \quad \text{(Equation 1)}$$

3. The method of claim 1, wherein the SOH update signal checking step comprises:
   an SOH update signal authorization step of checking whether the SOH update signal is applied to an SOH calculation unit; and
   an initial signal presence checking and use time checking step of checking whether a use period of the battery pack is within an initial use period when the SOH calculating unit is initially supplied with an initial SOH update signal.

4. The method of claim 3, wherein the final current integrated value calculation step comprises, when the SOH update signal applied to the SOH calculation unit is the initial SOH update signal and the use period of the battery pack is within the initial use period, calculating a final current integrated value until an SOC becomes 100 from 0 by using a value calculated through a proportional equation in the current integrated value calculation step corresponding to the SOC change amount.

5. The method of claim 1, wherein the battery pack SOH calculation step is calculated by the following Equation 2, $$SOH = \frac{\int (i + \text{error1}) \cdot dt}{\Delta SOC \times (\text{nominal capacity of battery pack})}. \quad \text{(Equation 2)}$$

6. A device for calculating an SOH of a battery pack, the device comprising:
   an SOC calculation unit for calculating an SOC of the battery at predetermined period intervals;
   an SOH calculation unit for calculating an SOH based on the SOC measured by the SOC calculation unit,
   wherein the SOC calculation unit comprises a current integrated value calculation module for calculating a current integrated value corresponding to an SOC change amount of the battery, and
   wherein the SOH calculation unit comprises:
   an SOH update signal checking module for checking whether or not the SOH update signal is applied;
   a final current integrated value calculation module for calculating a final current integrated value based on the current integrated value corresponding to the SOC change amount calculated by the current integrated value calculation module;
   a battery pack nominal capacity setting module for setting the nominal capacity of the battery pack; and
   an SOH calculation module for calculating the SOH of the battery pack.

7. The device of claim 6, wherein the current integrated value calculation module for calculating the current integrated value corresponding to the SOC change amount calculates a current integrated value based on the following Equation 1, and calculates a current integrated value corresponding to the SOC change amount at a predetermined period before the SOH update signal checking module checks the SOH update signal application, $$\Delta SOC = \int_{SOC_{start}}^{SOC_{end}} (i + \text{error1}) \cdot dt. \quad \text{(Equation 1)}$$

8. The device of claim 6, wherein the SOH update signal checking module comprises:
   a initial SOH signal checking module for checking whether the SOH update signal is the initial SOH update signal; and
   a user period checking module for checking whether the SOH update signal is within an initial use period preset in the battery pack.

9. The device of claim 8, wherein
   when the initial SOH update signal is the initial SOH update signal and the initial SOH update signal is applied within the initial use period of the battery pack according to a result checked by the SOH update signal checking module,
   the final current integrated value calculation module calculates a final current integrated value until an SOC becomes 100 from 0 by using a current integrated value corresponding to the SOC change amount through a proportional equation.

10. The device of claim 6, wherein the battery pack SOH calculation module calculates the SOH of the battery pack using Equation 2 below, $$SOH = \frac{\int (i + \text{error1}) \cdot dt}{\Delta SOC \times (\text{nominal capacity of battery pack})}. \quad \text{(Equation 2)}$$

* * * * *